United States Patent [19]

Akashi et al.

[11] 4,454,836
[45] Jun. 19, 1984

[54] VACUUM EVAPORATING APPARATUS UTILIZING MULTIPLE ROTATABLE CANS

[75] Inventors: Goro Akashi; Ryuji Shirahata, both of Kanagawa, Japan

[73] Assignee: Fuji Photo Film Co., Ltd., Kanagawa, Japan

[21] Appl. No.: 498,441

[22] Filed: May 26, 1983

Related U.S. Application Data

[60] Division of Ser. No. 443,996, Nov. 23, 1982, Pat. No. 4,403,002, which is a continuation of Ser. No. 213,130, Dec. 4, 1980, abandoned.

[30] Foreign Application Priority Data

Dec. 10, 1979 [JP] Japan .................. 54-160102
Dec. 10, 1979 [JP] Japan .................. 54-160103

[51] Int. Cl.³ .......................................... C23C 13/10
[52] U.S. Cl. ............................... 118/718; 118/719; 118/720; 118/726; 118/730; 118/733
[58] Field of Search ........... 118/720, 721, 718, 719, 118/733, 504, 726, 730, 50, 50.1, 325, 314, 315; 427/132, 128, 251, 255, 255.1, 177, 255.5, 178, 255.7, 424, 248.1, 53.1

[56] References Cited

U.S. PATENT DOCUMENTS

| | | | |
|---|---|---|---|
| 2,664,853 | 1/1954 | Schuler | 118/718 |
| 2,719,094 | 9/1955 | Clough et al. | 427/228 |
| 2,925,062 | 2/1960 | Schwindt | 118/733 X |
| 3,044,438 | 7/1962 | Osswald et al. | 118/718 |
| 3,227,132 | 1/1966 | Clough et al. | 118/733 |
| 3,498,259 | 3/1970 | Braguier | 118/718 |
| 3,683,847 | 8/1972 | Carleton | 118/720 X |
| 3,854,442 | 12/1974 | Adam et al. | 118/718 |
| 4,220,117 | 9/1980 | Shinohara | 118/718 |

Primary Examiner—John D. Smith
Assistant Examiner—Bernard F. Plantz
Attorney, Agent, or Firm—Sughrue, Mion, Zinn, Macpeak & Seas

[57] ABSTRACT

An apparatus for vacuum evaporating magnetic material onto a base. Cylindrical cans are disposed parallel to one another and rotated either in the same or opposite directions. A tape-shaped base is wound around the cans passing from an upper vacuum chamber to a lower vacuum chamber. A vacuum evaporation source is positioned in the lower chamber and directed to the tape-shaped base in a predetermined area on both sides of a gap between the cans or a line contact area between the cans.

4 Claims, 4 Drawing Figures

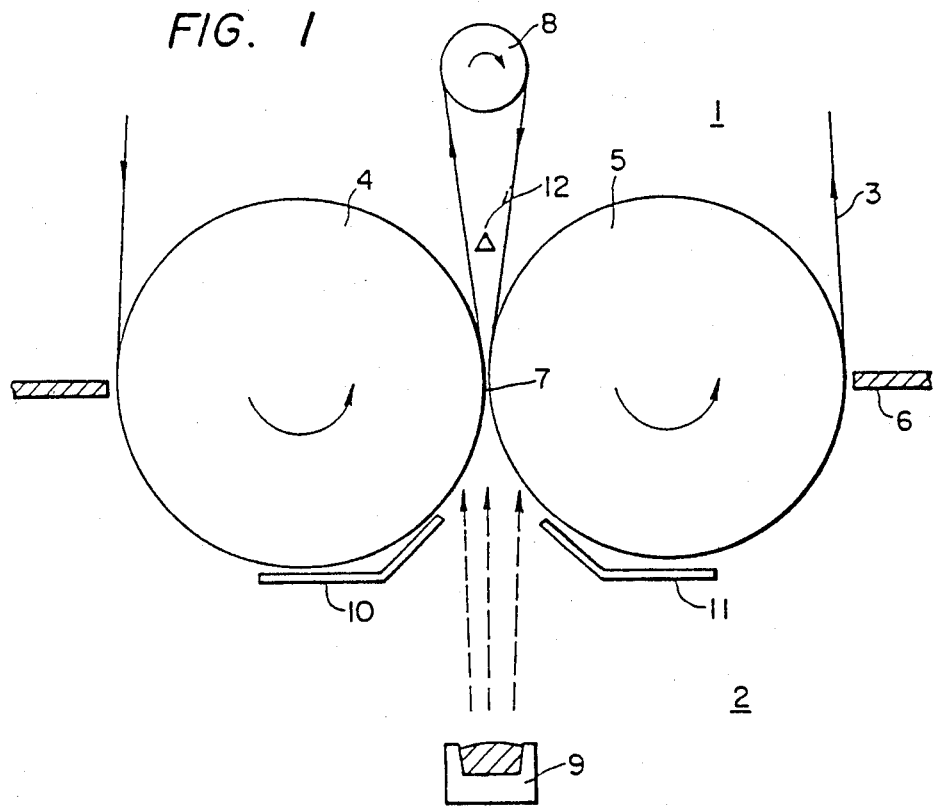
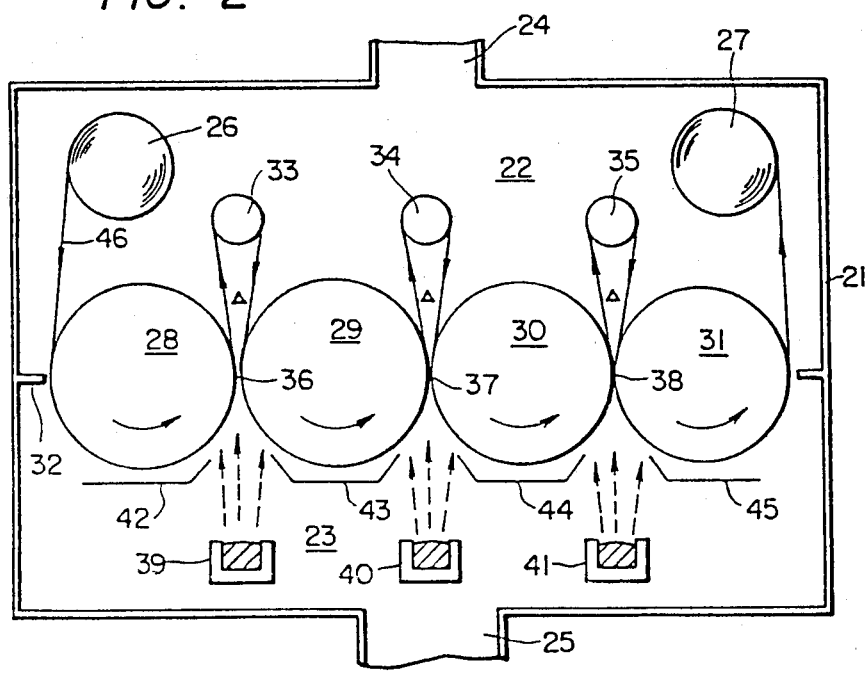

VACUUM EVAPORATING APPARATUS UTILIZING MULTIPLE ROTATABLE CANS

This is a Division of application Ser. No. 443,996, filed Nov. 23, 1982, now U.S. Pat. No. 4,403,002 which is a continuation of application Ser. No. 213,130 filed Dec. 4, 1980 now abandoned.

BACKGROUND OF THE INVENTION

The present invention relates to a vacuum evaporating apparatus for vacuum evaporation of magnetic layers onto a moving flexible tape- or strip-shaped base material such as high molecular material to thereby form a magnetic recording medium.

The following materials are conventionally used to form magnetic recording layers on a non-magnetic base: magnetic oxide powder such as $\gamma$-$Fe_2O_3$; $\gamma$-$Fe_2O_3$ doped with Co; $Fe_3O_4$; $Fe_3O_4$ doped with Co; berthollide of $\gamma$-$Fe_2O_3$ and $Fe_3O_4$; berthollide doped with Co, $CrO_2$ and the like or coating types of alloy magnetic powder, primarily Fe, Co, Ni and the like, which are dispersed in organic binder such as vinyl chloride-vinyl acetate copolymer; styrene-butadiene copolymer; epoxy resin; and polyurethane resin. The magnetic recording layers are dried after coating.

Recently, the demand for high density magnetic recording types has increased. At the same time, high magnetic metallic layers formed by methods of vacuum evaporating, sputtering, ion-plating or the like have been given great attention as so-called non-binder type magnetic recording mediums which do not require a binder. Efforts have been made to commercialize such a non-binder type recording medium. Among the methods proposed for evaporating non-binder types of recording mediums, an oblique vacuum evaporation method in which vapor beams of magnetic metal are obliquely projected onto a base material has been preferred because of its simplicity. A previously known apparatus for carrying out this method produces a layer having excellent magnetic characteristics.

According to the prior art oblique vacuum evaporating method, a high magnetic material or the like is first evaporated from a single evaporation source at a predetermined incidental angle or at an angle within a predetermined incidental angle range onto a tape-shaped base which is moved linearly or along a curved path formed by a conveying cylindrical cooling can. However, since the base surface is angled with respect to the evaporation source and since the final thickness of the vacuum-evaporated layer varies as the cosine of the angle by which the vapor beam deviates from a right angle with respect to the base surface, as the angle of incidence increases, the evaporation efficiency deteriorates remarkably. Furthermore, due to the geometric arrangement of the tape-shaped material and the evaporation source, as the angle of incidence increases, the distance between the base surface and the evaporation source must be increased which causes a degradation of the evaporation efficiency.

SUMMARY OF THE INVENTION

In order to overcome the disadvantages of prior art oblique vacuum deposition methods and apparatuses, the invention provides an apparatus for vacuum evaporating of vapor material onto a tape-shaped base wherein, according to a first embodiment, at least two cylindrical cans are disposed parallel to one another with a narrow gap between the cans. A vacuum pressure is provided both above and below the drums with the pressure below the cans being lower than that above. The cans are rotated in the same direction so as to transfer the tape-shaped base through the gap therebetween. Vapor material is vacuum evaporated from an evaporation source onto the tape-shaped base within a predetermined area on both sides of the gap as the tape-shaped base passes through the gap. If desired, three, four or more cans can be provided with vapor material onto the tape-shaped base taking place at each gap between the cans. Shielding means may be provided to confine the vapor material into the desired predetermined area on both sides of the gaps. Guide rollers may be provided above the gaps between the cans and the upper vacuum chamber for guiding the tape-shaped base through desired positions in the gaps.

According to another embodiment of the invention, two parallel cylindrical cans are provided in contact with each other and are rotated in opposite directions. A vacuum pressure is provided both above and below the cans with the pressure below the cans being less than that above the cans. First and second tape-shaped bases are passed through the line contact area between the cans with deposition material vacuum evaporated onto the tape-shaped base below the cans in a predetermined area on both sides of the contact area. If desired, third or further cans can be provided parallel to the first and second cans with adjacent cans rotating in opposite directions from one another.

BRIEF DESCRIPTION OF THE DRAWINGS

FIG. 1 is a cross-sectional view of a first preferred embodiment of an oblique vacuum evaporation apparatus of the invention;

FIG. 2 is a cross-sectional view of a second preferred embodiment of an oblique vacuum evaporation apparatus of the invention;

DESCRIPTION OF THE PREFERRED EMBODIMENTS

Figure 3:
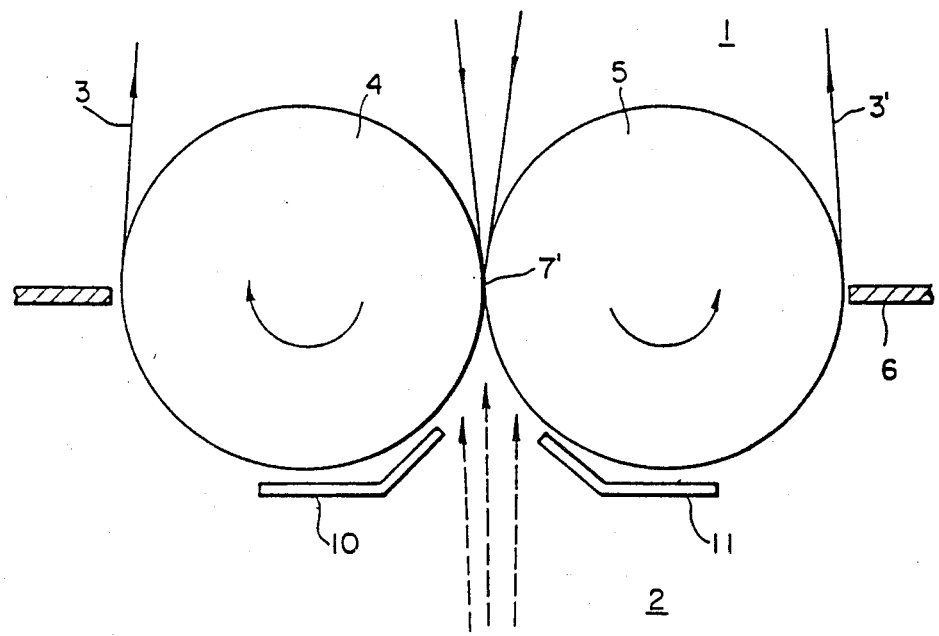
FIG. 3 is a cross-sectional view of a third preferred embodiment of an oblique vacuum evaporation apparatus of the invention.

The present invention will hereinafter be described with reference to the accompanying drawings.

FIG. 1 is a cross-sectional view of an apparatus of a first embodiment for practicing the vacuum evaporation method according to the present invention. The inside of a vacuum chamber is divided into an upper chamber 1 under a relatively low vacuum and a lower chamber 2 under a relatively high vacuum each of which is evacuated individually. In the upper chamber are disposed feeding and take-up rolls for a flexible tape-shaped base 3 as well as dancer rollers and expander rollers therefor. The required differential pressure between the chambers is maintained by the presence of cylindrical cooling cans 4 and 5 and partitioning walls 6. The flexible tape-shaped base 3 is moved along the can surfaces by the rotation of the cans 4 and 5 in the lower chamber 2. Between the cans 4 and 5 is formed an extremely narrow gap 7. The flexible tape-shaped base 3 travels upwardly along the can 4 around a guide roller 8 and then downwardly along the can 5. It is to be noted that the gap 7 is formed between the surfaces of tape parts which are moving in opposite directions from one another and that the gap is sufficiently wide that the tape surfaces do not scrape against each other.

An evaporation source 9 is disposed below the gap 7 defined by the cans 4 and 5. Oblique evaporation is achieved beyond a pair of masks 10 and 11 on the flexible tape base 3 moving along the cans 4 and 5. As shown in FIG. 1, it is possible to provide a mask 12 for blocking the small amount of vapor material which passes through the gap between the cans 4 and 5.

With the use of the present invention, the evaporation efficiency is greatly enhanced since evaporation of the magnetic material onto both tape parts of the flexible tape-shaped base 3 moving along the cans 4 and 5 takes place simultaneously.

The distribution of the layer thickness produced by the evaporation source 9 is represented by $COS^n$. In case the magnetic metallic material or the like is evaporated by using electron beam heating, the exponent n is 2 to 3 so that the evaporation beam is mainly evaporated upwards of the evaporation source. According to the present invention, the vapor beam emitted upwards of the evaporation source 9 is effectively utilized.

As proposed in Japanese Laid Open patent application No. 77/129409, alternative oblique evaporation can be achieved symmetrically with respect to a normal line of a base material surface for producing a magnetic recording medium using oblique evaporation. It is clear that the present invention can be applicable to this method.

The following materials are preferable for the high magnetic metal forming the magnetic thin layer utilizing the vacuum evaporation method the invention: pure metals; Fe, Co, Ni or the like; and fellomagnetic alloys including Fe-Co, Fe-Ni, Co-Ni, Fe-Co-Ni, Fe-Rh, Fe-Cu, Co-Cu, Co-Au, Co-Y, Co-La, Co-Pr, Co-Gd, Co-Sm, Co-Pt, Ni-Cu, Mn-Bi, Mn-Sb, Mn-Al, Fe-Cr, Co-Cr, Ni-Cr, Fe-Co-Cr, and Fe-Co-Ni-Cr or the like. Since a magnetic layer must be thick to provide a sufficient output power as a magnetic recording medium and must be thin to provide high density recording, the thickness of the evaporated magnetic medium should most generally be 0.05 $\mu$m to 1.0 $\mu$m and more preferably 0.1 $\mu$m to 0.4 $\mu$m. A plastic base such as polyethylene terephthalate, polyimide, polyamide, polyvinyl chloride, cellulose triacetate, polyethylene naphthalate or the like, or a metallic strip such as Al, Al alloy, Ti, Ti alloy, stainless steel or the like may be used as the flexible base.

A resistance heating method, a laser beam method, a radio frequency induction heating method, an electron beam heating method or the like can be used to heat the evaporation source. For feeding evaporation material, it is preferred to supply the material in the form of a wire or the like.

FIG. 2 shows another embodiment of an apparatus for carrying out a vacuum evaporation method according to the present invention. The inside of a vacuum container 21 is separated into a take-up chamber 22 at a relatively low vacuum and a deposition chamber 23 at a relatively high vacuum. Air from the two chambers is discharged through separate evacuating outlets 24 and 25. A feeding roll 26 and a take-up roll 27 are disposed in the take-up chamber 22 for transporting a flexible tape-shaped base 46. Both chambers are maintained at a required differential pressure by cylindrical cans 28, 29, 30 and 31 and a partitioning wall 32. The flexible tape-shaped base is transferred along the surfaces of the cans 28 to 31 synchronously with the rotation of the cans which all rotate in the same direction. The base is guided by guide rollers 33, 34 and 35 disposed between adjacent cans. Gaps 36, 37 and 38 are formed between the adjacent cans 28 and 29, 29 and 30 and 30 and 31, respectively. The gaps 36 to 38 are extremely narrow in width but the evaporation surfaces of the flexible tape-shaped bases moving oppositely to each other are not in contact with each other. Evaporation sources 39, 40 and 41 are disposed below the gaps 36, 37 and 38 and the oblique evaporations are carried out on the flexible tape-shaped base 46 through masks 42, 43, 44 and 45.

Still another embodiment of an apparatus for carrying out a method according to the invention will be described with reference to FIG. 3 in which like members are designated by like reference numerals as used in FIG. 1. In FIG. 3, two flexible tape-shaped bases 3 and 3' are provided and the cylindrical cans 4 and 5 are rotated in opposite directions at the same circumferential speed. In FIG. 3, the guide rollers 8 and 33 to 35 can be dispensed with. Thus, substantially the same effect can be obtained as with the apparatus shown in FIG. 3. However, it is to be noted that the cylindrical can 4 and the cylindrical can 5 are in contact with each other at a position 7' and the flexible tape-shaped bases 3 and 3' are transferred downwardly at the position 7'. The circumferential speeds of the cylindrical cans 4 and 5 must be maintained at the same value at the contact position 7'.

Figure 4:
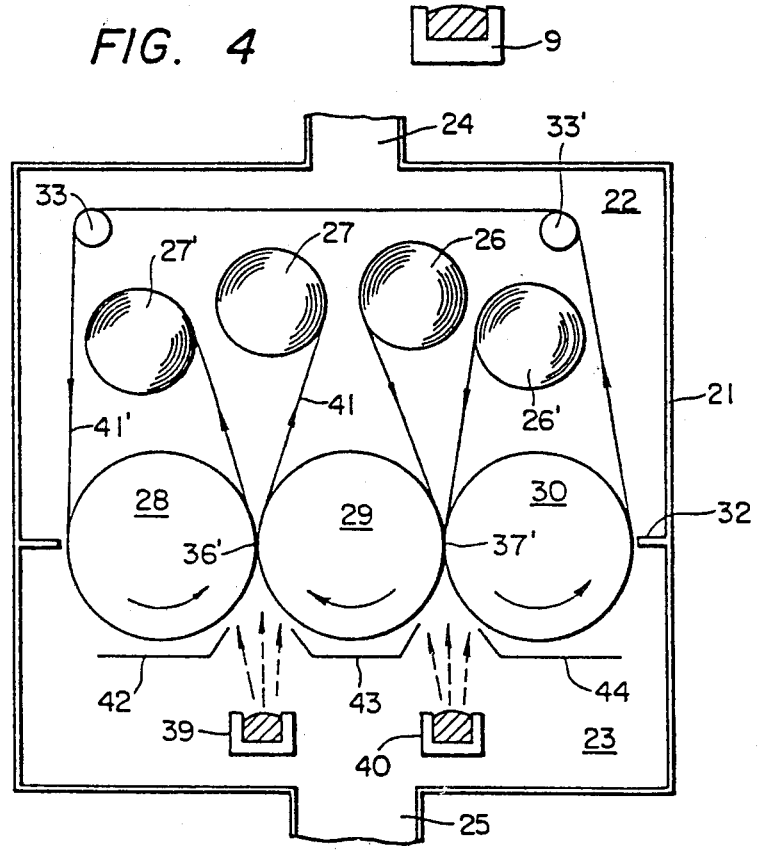
FIG. 4 is a cross-sectional view of a fourth preferred embodiment of an oblique vacuum evaporation apparatus of the invention.

FIG. 4 shows still another embodiment of an apparatus for performing a method of the present invention. In FIG. 4, like members are denoted by like reference numerals as used in FIG. 2. The construction shown in FIG. 4 is substantially the same as that shown in FIG. 2. However, a flexible tape-shaped base 41 is fed from a feeding roll 26 via a cylindrical can 29 to a take-up roll 27 while another tape-shaped base 41' is fed from a feeding roll 26' via a cylindrical can 30, guide rollers 33 and 33' and a cylindrical can 28 to a take-up roll 27'. In this arrangement, the adjacent cans 28 and 29, and 29 and 30, which are rotated in the opposite directions to each other, are in contact with each other at positions 36' and 37', respectively. At the contact position 36', the flexible tape-shaped bases 41 and 41' are advanced upwardly along the cylindrical cans 28 and 29 while at the contact position 37', the flexible tape-shaped bases 41 and 41' are advanced downwardly along the cylindrical cans 29 and 30. The evaporations are achieved in the same manner as previously described.

What is claimed is:

1. Apparatus for vacuum evaporation onto a tape-shaped base comprising:

first and second cans disposed parallel to one another with a narrow gap between said cans to maintain a vacuum degree difference between upper and lower sides of the cans;

means for rotating said cans in the same direction;

a vacuum chamber disposed around said cans, said vacuum chamber being divided into an upper chamber under a first vacuum and a lower chamber under a second vacuum lower in vacuum than said first vacuum, upper portions of said cans being in said upper chamber and lower portions of said cans being in said lower chamber;

a guide roller disposed in said upper chamber between said cans for guiding said tape-shaped base through said gap;

a vacuum evaporation source directed toward said tape-shaped base to deposit a vapor material on said base as it passes through said gap in said lower chamber; and shielding means disposed between said evaporation source and said cans for restricting the evaporation of said vapor material solely to a predetermined area on both sides of said gap on said tape-shaped base.

2. The apparatus of claim 1 further comprising third and fourther rotating cans disposed parallel to one another and in a line with said first and second cans with upper portions of said third and fourth cans being in said upper chamber and lower portions of said third and fourth cans being in said lower chamber, narrow gaps being formed between said second and third cans and between said third and fourth cans;

second and third guide rollers, said second guide roller being positioned in said upper chamber above and between said second and third cans and said third guide roller being positioned in said upper chamber above and between said third and fourth cans, said second guide roller guiding said tape-shaped base through the gap between said second and third rollers and said third roller guiding said tape-shaped base through the gap between said third and fourth cans;

second and third evaporation sources, said second evaporation source being directed to evaporate vapor material onto said tape-shaped base as it passes through said gap between said second and third rollers and said third evaporation source being directed to evaporate vapor material onto said tape-shaped base as it passes through said gap between said third and fourth cans; and second shielding means for restricting the evaporation of vapor material to predetermined areas on both sides of said gap between said second and third cans and between said third and fourth cans.

3. Apparatus for vacuum evaporation onto a tape-shaped base comprising:

first and second cans disposed parallel to and in line contact with one another to maintain a vacuum degree difference between upper and lower sides of the cans;

means for rotating said drums in opposite directions;

means for supplying first and second tape-shaped bases through the line contact area between said cans, said first tape-shaped base being moved around at least a portion of said first can and said second tape-shaped base moving around at least a portion of said second can;

vacuum chamber having upper and lower chambers, said chamber being at a first vacuum and said lower chamber being at a second vacuum lower in vacuum than said upper chamber;

an evaporation source for directing vapor material onto said first and second tape-shaped bases in a predetermined area on both sides of said line contact area; and shielding means for confining said vapor material solely to said predetermined region.

4. The apparatus of claim 3 further comprising a third can disposed in line contact with said second can on the side thereof opposite said first can;

means for supplying a third tape-shaped base into the line contact area between said second and third cans;

a second evaporation source for directing vapor material onto said second and third tape-shaped bases in a predetermined area on both sides of said line contact area; and second shielding means for confining the evaporation of vapor material to said predetermined area on both sides of said line contact area between said second and third cans.

* * * * *